United States Patent
Trias

(10) Patent No.: US 8,849,614 B2
(45) Date of Patent: Sep. 30, 2014

(54) SYSTEM AND METHOD FOR MONITORING AND MANAGING THREE-PHASE POWER FLOWS IN ELECTRICAL TRANSMISSION AND DISTRIBUTION NETWORKS

(75) Inventor: Antonio Trias, Sant Cugat del Valles (ES)

(73) Assignee: Gridquant, Inc., Savannah, GA (US)

( * ) Notice: Subject to any disclaimer, the term of this patent is extended or adjusted under 35 U.S.C. 154(b) by 518 days.

(21) Appl. No.: 13/152,994

(22) Filed: Jun. 3, 2011

(65) Prior Publication Data

US 2011/0257933 A1 Oct. 20, 2011

Related U.S. Application Data

(63) Continuation-in-part of application No. 12/384,254, filed on Apr. 2, 2009, now Pat. No. 7,979,239, which is a continuation of application No. 11/323,841, filed on Dec. 30, 2005, now Pat. No. 7,519,506, which is a continuation-in-part of application No. 10/702,293, filed on Nov. 6, 2003, now abandoned.

(60) Provisional application No. 60/424,351, filed on Nov. 6, 2002.

(51) Int. Cl.
| | |
|---|---|
| G06F 11/30 | (2006.01) |
| G06G 7/54 | (2006.01) |
| G05D 3/12 | (2006.01) |
| G01R 21/00 | (2006.01) |
| H02H 1/00 | (2006.01) |
| H02J 3/00 | (2006.01) |

(52) U.S. Cl.
CPC . *H02J 3/00* (2013.01); *G01R 21/00* (2013.01); *H02H 1/00* (2013.01); *H02J 2003/007* (2013.01); *Y02E 40/72* (2013.01); *Y04S 40/22* (2013.01); *Y02E 60/76* (2013.01)
USPC ............................ 702/182; 703/18; 700/286

(58) Field of Classification Search
USPC ......... 702/182, 57, 60, 64–65, 72, 75, 81, 84, 702/106, 127, 188–189; 700/286, 291, 293, 700/295, 297; 703/4, 13, 18
See application file for complete search history.

(56) References Cited

U.S. PATENT DOCUMENTS

| | | |
|---|---|---|
| 5,734,586 A | 3/1998 | Chiang et al. |
| 5,745,368 A | 4/1998 | Ejebe et al. |

(Continued)

OTHER PUBLICATIONS

X.P. Zhang, Fast Three Phase Load Flow Methods, Aug. 1996, IEEE Transactions on Power Systems, vol. 11, No. 3, pp. 1547-1554.*

(Continued)

*Primary Examiner* — Toan Le
(74) *Attorney, Agent, or Firm* — Gibb & Riley, LLC

(57) ABSTRACT

A system and method for monitoring and managing three-phase power flows in electrical transmission and distribution networks through the use of a deterministic, non-iterative method using an holomorphic embedding and algebraic approximants for determining the power flows in the three phases of a power generating system having an electrical grid. Such method is capable of determining whether or not a physical solution to the load flow problem exists, or if the system is in a state of voltage collapse. It may be employed in either real-time or off-line analytic applications for balanced or unbalanced electric power systems, in particular for monitoring and analyzing unbalanced conditions in three-phase electrical networks and for the accurate calculation of short-circuit conditions.

15 Claims, 1 Drawing Sheet

(56) References Cited

U.S. PATENT DOCUMENTS

| | | | |
|---|---|---|---|
| 7,209,839 B2 | 4/2007 | Roytelman | |
| 7,519,506 B2 * | 4/2009 | Trias | 702/182 |
| 7,584,066 B2 | 9/2009 | Roytelman | |
| 7,769,497 B2 | 8/2010 | Patel | |
| 7,813,884 B2 | 10/2010 | Chu et al. | |
| 7,979,239 B2 * | 7/2011 | Trias | 702/182 |

OTHER PUBLICATIONS

R.G. Wasley et al., Newton-Raphson Algorithm for Three Phase Load Flow, Proc. IEE, vol. 121, Nov. 7, 1974, pp. 630-638.

J. Arillaga et al., Fast-Decoupled Three Phase Load Flow, Proc. IEE, vol. 125, No. 8, 1978, pp. 734-740.

X.P. Zhang, Fast Three Phase Load Flow Methods, IEEE Transactions on Power Systems, vol. 11, No. 3, Aug. 1996, pp. 1547-1554.

B.K. Chen et al., Hybrid Three Phase Load Flow, IEE Proceedings C, vol. 137, No. 3, May 1990, pp. 177-185.

C.S. Cheng et al., A Three-Phase Power Flow Method for Real-Time Distribution System Analysis, IEEE Transactions on Power Systems, vol. 10, No. 2, May 1995, pp. 671-679.

B.C. Smith et al., Improved Three-Phase Power-Flow Using Phase and Sequence Components, IEE Proceedings C, vol. 145, No. 3, May 1998, pp. 245-250.

M. Valcarcel et al., Harmonic Power Flow for Unbalanced Systems, IEEE Transactions on Power Delivery vol. 8, No. 4, Oct. 1993, pp. 2052-2059.

W. Xu et al., A Multiphase Harmonic Load Flow Solution Technique, IEEE Transactions on Power Systems, vol. 6, No. 1, Feb. 1991, pp. 174-182.

P.A.N. Garcia et al., Three-Phase Power Flow Calculations Using the Current Injection Method, IEEE Transactions on Power Systems, vol. 15, No. 2, May 2000, pp. 508-514.

W. Xu et al., Three-Phase Power Flow and Harmonic Analysis, Electric Energy Systems: Analysis and Operation, A. Gomez-Exposito, A.J. Conejo, C. Canizares Eds., CRC Press, 2009.

Tolkias et al., Homotopy Methods for Solving Decoupled Power Flow Equations, IEEE International Symposium on Circuits and Systems, 1992, vol. 6, May 1992, pp. 2833-2839.

C.A. Canizares et al., Point of Collapse and Continuation Methods for Large AC/DC Systems, IEEE Trans. Power Systems, vol. 8, No. 1, Feb. 1993, pp. 1-8.

S.X. Guo et al., The Homotopy Continuation Method to Approach Voltage Collapse of Electric Power Systems, IEEE International Symposium on Circuits and Systems, 1993, vol. 4, May 1993, pp. 2644-2647.

* cited by examiner

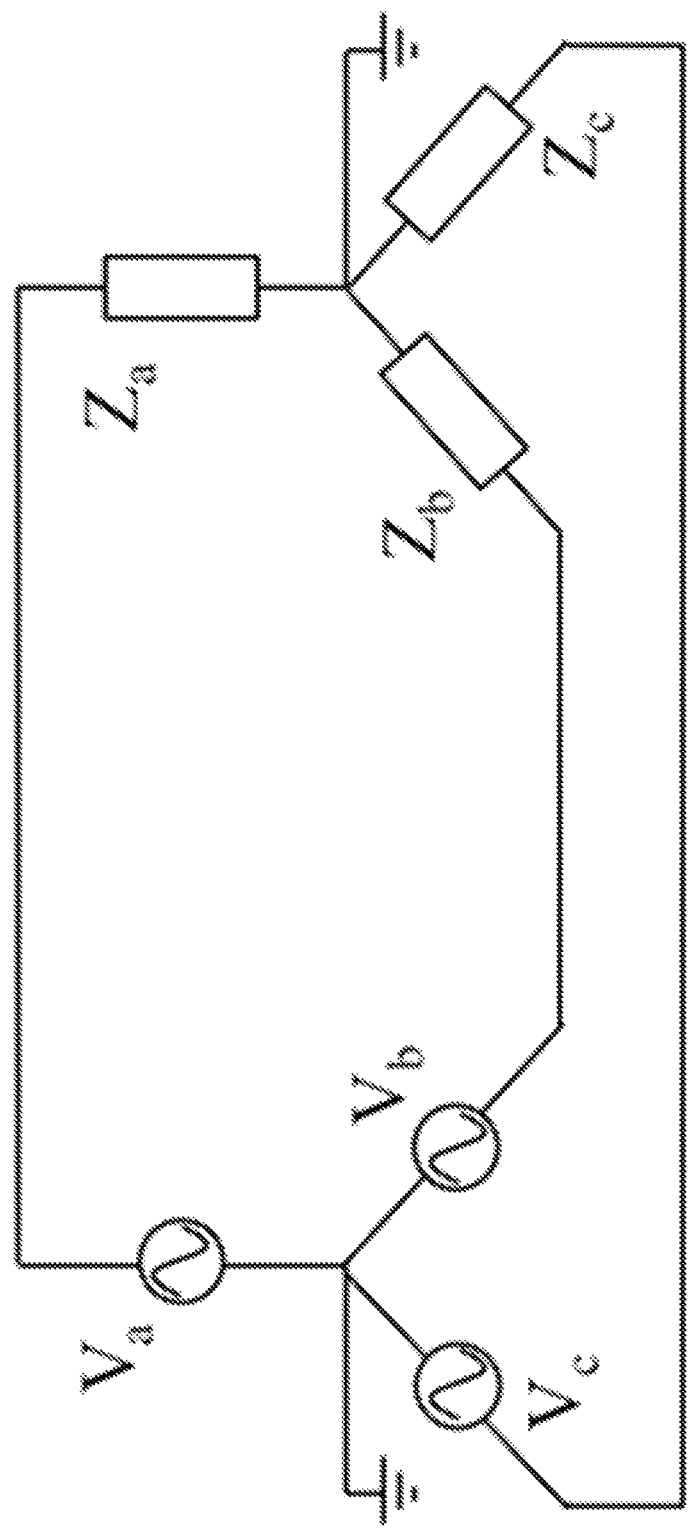

SYSTEM AND METHOD FOR MONITORING AND MANAGING THREE-PHASE POWER FLOWS IN ELECTRICAL TRANSMISSION AND DISTRIBUTION NETWORKS

CROSS-REFERENCE TO RELATED APPLICATIONS

This application is a continuation-in-part of U.S. patent application Ser. No. 12/384,254, now U.S. Pat. no. 7,979,239, entitled "System and Method for Monitoring and Managing Electrical Power Transmission and Distribution Networks", filed with the U.S. Patent and Trademark Office on Apr. 2, 2009, which is a continuation of U.S. patent application Ser. No. 11/323,841, now U.S. Pat. no. 7,519,506, filed with the U.S. Patent and Trademark Office on Dec. 30, 2005, which is a continuation-in-part of U.S. patent application Ser. No. 10/702,293, filed with the U.S. Patent and Trademark Office on Nov. 6, 2003, abandoned, which is based upon and claims benefit of U.S. Provisional Patent Application Ser. No. 60/424,351, filed with the U.S. Patent and Trademark Office on Nov. 6, 2002, by the inventor herein, the specifications of which are incorporated herein by reference.

BACKGROUND

1. Field of the Invention

The present invention relates to monitoring and analysis of both balanced and unbalanced three-phase electrical power transmission and distribution networks, and more particularly to a system and method for determining the grid state of such a network by determining the power flows using a deterministic, non-iterative, real time analysis of the network.

2. Description of the Background

The main objective of a three-phase power flow analysis is to determine with sufficient accuracy the voltages and flows in the three phases of the network, in order to calculate the degree of imbalance present in the system. Although most three-phase power systems are designed and built in a balanced configuration, there are certain types of loads that produce unbalanced conditions. Important examples are high-speed trains and AC arc furnaces. Imbalances in the network cause overheating in rotating machines, and displacements of zero-crossings in static power converters, generating harmonics that in turn cause other types of problems to equipment connected to the network. Imbalances are one of the main criteria in evaluating power quality supply, and utilities strive to minimize it. Therefore, the three-phase power flow analysis is the main tool for the study and monitoring of imbalances. It is also the first step of a more complex analysis known as three-phase harmonic power flow, in which the network is analyzed for the presence and propagation of voltages and currents with frequencies that are higher-order harmonics of the fundamental one.

The main subject of three-phase power flow studies are distribution networks, where the degree of imbalance is potentially larger. Transmission networks are always operated with negligible imbalances, unless there is an unbalanced fault condition. Consequently, many three-phase power flow methods have focused on distribution networks and have tried to take advantage of the mostly-radial (i.e. tree-like) structure they have. However, the current trend towards the so-called smart-grid, with smaller, distributed generation such as solar, wind and other renewables, is changing distribution networks to be more meshed in nature, with more branches in which the direction of flow may reverse. Therefore, the power flow methods used for distribution networks may no longer make assumptions about the radial structure, and have to use the general-purpose calculations for meshed networks, as in transmission grids.

Early three-phase load flow methods were rather straightforward extensions of the conventional Newton-Raphson methods used for one-phase circuits; see for example R. G. Wasley et al. 1974, or J. Arrillaga et al. 1978. X. P. Zhang 1996 describes methods to calculate the load flow equations in terms of symmetrical components, dubbed Sequence Decoupling-Compensation Newton-Raphson and Sequence Decoupling-Compensation Fast Decoupled, where the underlying technique for the solvers is either Newton-Raphson or Fast-Decoupled Newton-Raphson, respectively. The hybrid method described by B. K. Chen et al. 1990, based on Gauss-Seidel iteration, combines an implicit Z-bus treatment with the more traditional bus admittance methods, in order to improve convergence on very long radial systems typical of distribution networks. U.S. Pat. No. 5,734,586 to Chiang et al. shows a method to control distribution networks with radial structure and imbalances, in order to achieve steady state in real-time.

C. S. Cheng et al. 1995 extend to three-phase systems the so-called compensation method, which exploits the near-radial (i.e. weakly meshed) nature of distribution networks by means of an iterative technique that sweeps backward and forward across the tree topology. A method that allows the combination of phase and symmetrical components, based on PQ residuals, is shown in B. C. Smith et al. 1998. An alternative formulation based on current residuals is proposed in P. A. N. Garcia et al. 2000.

Other methods have been proposed in order to improve the flexibility in the modeling and wiring configuration of PQ buses, such as M. Valcarcel et al. 1993; and U.S. Pat. No. 7,209,839 to Roytelman, which shows a way to deal specifically with loads on "floating" delta-connected transformers. Although not strictly related to solving a power flow problem, U.S. Pat. No. 7,584,066 to Roytelman discloses a method to estimate individual feeder loads when the only information available is the total substation PQ injection and the individual feeder current magnitudes.

The method of W. Xu et al. 1991 offers greater flexibility in the modeling of both PQ and PV buses. A method combining the formulation based on current residuals, flexible treatment of PQ/PV buses, and symmetrical components, is presented in W. Xu et al. 2009.

It is pertinent to point out that all the methods cited above are iterative in nature. Even the most recent advances in power flow-solving techniques for one-phase networks (which eventually are extended to three-phase networks) involve iterative schemes. See for instance U.S. Pat. No. 7,769,497 to Patel, which discloses a method to improve the convergence rate of the iteration; and U.S. Pat. No. 7,813,884 to Chu et al., which discloses a method to include modern FACT devices such as STATCOMs and UPFCs in a unified way while preserving the quadratic convergence rate of Newton-Raphson.

The shortcoming of all previous-art methods is that, since the mathematical equations of a power flow problem are multi-valued, iterative techniques cannot guarantee that the iteration does not converge to a spurious solution (one in which one or more buses end up on the lower branch of their nose-like P-V curve). Methods that employ numerical continuation (see for instance Tolikas et al. 1992, C. A. Canizares et al. 1993, and Guo et al. 1993; see also U.S. Pat. No. 5,745,368 to Ejebe et al.) somehow alleviate this problem, but they cannot eliminate it completely because of the fractal nature of the attractor sets. Moreover, such methods are computationally costly and they are mostly oriented to the precise calculation of voltage collapse points, not for general power flow computation.

SUMMARY

Disclosed herein is a deterministic, non-iterative method that improves the existing methods to solve the power flow equations of any balanced or unbalanced three-phase power system. The method disclosed herein extends the method disclosed in U.S. Pat. No. 7,519,506, by providing the necessary steps to solve the power flow equations in the presence of features that are absent in the one-phase case: namely, mutual admittances between the phases, structural imbalances in both the self and mutual admittances, and modeling parameters and/or constraints expressed in the usual symmetrical-components formalism.

Such method in turn provides improved and more reliable methods for state estimation, harmonic analysis, generation of restoration plans, the construction of PV and QV curves, voltage stability and contingency analysis, optimal power flow, and control of operation limits. The method may also be used to calculate power-flows under short-circuit conditions, providing solutions that are far more accurate than the traditional fault-current calculations. This is important when the pre-fault condition of the network is stressed.

The method is direct, constructive, and guaranteed to yield the correct solution among the multiple ones. The power flow equations are multi-valued, but only one solution corresponds to the real operating conditions of a stable network. Therefore, the method is free of all the convergence problems that are present in other iterative methods, whether based on Newton-Raphson iteration or on variations of it.

In a preferred embodiment of the method of the invention, a physical solution of the central three-phase power flow problem is found using the following steps:

a) For any PV bus being modeled in terms of symmetrical components (the most usual case), transform their negative-sequence and zero-sequence admittances into their phase-sequence equivalent admittances.

b) For any PQ load being modeled in terms of symmetrical components (typically the case for rotating machine loads with unequal positive and negative sequence admittances), transform their negative-sequence and zero-sequence admittances into their phase-sequence equivalent admittances.

c) Write down the power flow problem in terms of the three phase components, using the parameters found in the previous two steps and all other injections specified in terms of phase components.

d) Embed the power flow problem L in a holomorphic embedding L(s), in terms of one complex parameter s that goes continuously from the s=0 limit (representing the no-load case, in which there is no non-linear injections at any bus and therefore is trivially solvable) to the s=1 limit representing the actual problem case;

e) Using the holomorphic property, develop in power series expansion the values of the equation's unknowns in the parameter of the embedding in a neighborhood of the no-load case value of the parameter;

f) Find the values of the coefficients of such expansion by solving the resulting linear systems, order after order of the power series, up to an order determined by the desired accuracy; and g) Find the value for the equation's unknowns in the problem case, s=1, computing the power series summation to the desired accuracy by using well-known methods of approximation theory, n-order algebraic Padé approximants.

For suitable analytical approximation techniques based on algebraic approximants (continued fractions or Padé approximants, for instance), the above-described procedure always gives the correct solution (i.e., the real operating condition of the stable network) when it exists. If no solution exists, then we are at the state of voltage collapse of the power system. The present invention thus relates to a constructive and fully reliable method for finding such a solution (or determining that no solution exists and thus that the system is at voltage collapse), and a system for employing such method.

DESCRIPTION OF THE DRAWINGS

FIG. 1 is a representation of a three-phase network.

DETAILED DESCRIPTION OF EXEMPLARY EMBODIMENTS

Application of the method described in parent U.S. Pat. No. 7,519,506 to three-phase networks is not straightforward due to the various ways in which the phases are wired and, in particular, the way that injection magnitudes are typically specified when solving a power flow problem. The method described herein is presented under two different embodiments: a first one in which the full admittance matrix is used for the whole system comprising the three phases (slower, but allowing for arbitrary imbalances in the network and providing a simpler implementation); and a second one in which we take advantage of cases in which the imbalances are not very large (more efficient implementation, while at the same time retaining full precision). These methods can also be applied to the problem of calculating the power-flow solution under short-circuit conditions, providing a more exact solution that contrasts to the traditional fault-current calculations, in which the problem is grossly approximated by linearization.

Referring to the drawings, FIG. 1 shows an elementary three-phase network having an ideal voltage source connected in a grounded delta arrangement and a (possibly unbalanced) load that is also delta-connected. The figure will be used for the purposes of this exposition, but the method hereby described is not tied to this particular wiring arrangement; any engineer skilled in the field will be able to apply the method for any other type of three-phase wiring such as ungrounded delta, "wye", or any combination thereof.

Using the traditional abc labeling of phase components, the fundamental equation given by Ohm's law is:

$$\begin{pmatrix} V_a \\ V_b \\ V_c \end{pmatrix} = \begin{pmatrix} Z_a & Z_{ab} & Z_{ac} \\ Z_{ba} & Z_b & Z_{bc} \\ Z_{ca} & Z_{cb} & Z_c \end{pmatrix} \begin{pmatrix} I_a \\ I_b \\ I_c \end{pmatrix} \quad (1)$$

The off-diagonal impedances in equation (1) represent mutual cross-phase impedances, which couple the voltages and currents in the three phases abc. In the one-line modeling of balanced power systems, these mutual impedances are considered to be included in the self-impedance; however, in solving general three-phase networks we should consider them explicitly. Therefore, the power flow equations for a full network consisting of N nodes consist of a 3N×3N complex admittance matrix. However, the well-known technique of symmetrical components (see J. L. Blackburn 1993; P. M.

Anderson 1995) allows one to simplify the equations in some particular cases, if and only if the network impedances are balanced, so as to have:

$$z_a = z_b = z_c \equiv z_{self}$$

$$z_{ab} = z_{bc} = z_{ca} \equiv z_{m+}$$

$$z_{ba} = z_{cb} = z_{ac} \equiv z_{m-} \quad (2)$$

Then equation (1) decouples completely when V and I are written in terms of their symmetrical components:

$$\begin{pmatrix} V_0 \\ V_1 \\ V_2 \end{pmatrix} = \begin{pmatrix} Z_{self} + Z_{m+} + Z_{m+} & 0 & 0 \\ 0 & Z_{self} + a^2 Z_{m+} + a Z_{m+} & 0 \\ 0 & 0 & Z_{self} + a Z_{m+} + a^2 Z_{m+} \end{pmatrix} \begin{pmatrix} I_0 \\ I_1 \\ I_2 \end{pmatrix} \quad (3)$$

where $$a = e^{j\frac{2\pi}{3}}.$$

The relationship between the abc phase components of both V and I and their 012 symmetrical components counterparts is given by the well-known linear transformation:

$$\begin{pmatrix} V_0 \\ V_1 \\ V_2 \end{pmatrix} = \frac{1}{3} \begin{pmatrix} 1 & 1 & 1 \\ 1 & a & a^2 \\ 1 & a^2 & a \end{pmatrix} \begin{pmatrix} V_a \\ V_b \\ V_c \end{pmatrix} \quad (3.1)$$

and an analogous linear transformation for the current I. The 012 symmetrical components are also referred to as "zero-sequence", "positive-sequence", and "negative-sequence" components respectively.

As we can see, the advantage of working in the 012 representation is that, when the network has a balanced structure as per equation (2), the 3N ×3N complex admittance matrix decouples into three independent N ×N sub-matrices. Since all power flow methods (including this one) involve solving linear systems associated to this matrix, the algorithmic savings can be very important, as the complexity is potentially $O(N^3)$. It is usually much less because of the matrix sparsity, but it is nevertheless not linear in N.

Another advantage of the symmetrical components technique is that when both the network and the voltage sources are balanced but the loads are not, the values of the zero and negative sequence directly inform us about the degree of imbalance. In a perfectly balanced network with balanced sources and loads, only positive-sequence magnitudes are non-zero.

The methods we describe here can be implemented in any formalism, either phase components or symmetrical components. The choice will mostly depend on how unbalanced loads are modeled and specified for the problem at hand. For instance, most generic loads can be specified as PQ phase component values (in their delta or grounded/ungrounded wye variants), but rotating machine loads are typically specified as a combination of their PQ positive-sequence value and their zero-sequence and negative sequence admittances. Similarly, PV buses may also specify their zero-sequence and negative sequence admittances, besides their PV (positive-sequence) values. The description below shows how to treat these cases, so that the method can be applied successfully to real world three-phase problems. Thus, it is shown how the key innovative ingredients of the invention, namely the holomorphic embedding technique that allows a direct solving method via algebraic approximants, can be extended to three-phase networks.

In a first preferred embodiment of the method, we will consider a power network with arbitrary structural imbalances. Since we assume that equation (2) does not hold, there is not any algorithmic advantage in working with symmetrical components, and therefore we will work with the abc phase components, in rectangular coordinates.

Let us consider a 3N-bus three-phase power network, and let $Y_{ij}$ be the admittance between buses i and j. The ordering of the matrix is not important but for the purpose of the exposition buses will be labeled so that the abc components of each bus are consecutive. $V_i$ is the complex voltage at each bus (buses 1, 2, 3 being swing buses). At each bus, an injection of the most general type is considered, in order to account for loads that may be modeled as either constant power S, constant current I, or constant admittance Y. Therefore, the system of power flow equations, which will be designated as L, can be written as the balance of currents at each bus:

$$\sum_{j=1}^{aN} Y_{ij} V_j = \frac{S_i^*}{V_i^*} + I_i + Y_i V_i$$

For those rotating loads that are modeled as a combination of positive-sequence constant power S, plus zero-sequence constant admittance $Y^0$ and negative-sequence constant admittance $Y^{neg}$, their injections need to be converted into their phase-sequence equivalents. By the theory of symmetrical components, the corresponding abc admittances for the injection terms corresponding to those loads will be as follows (see P. M. Anderson 1995, for instance):

$$\frac{1}{3} \begin{pmatrix} Y^0 + Y^{neg} & Y^0 + a^2 Y^{neg} & Y^0 + a Y^{neg} \\ Y^0 + a Y^{neg} & Y^0 + Y^{neg} & Y^0 + a^2 Y^{neg} \\ Y^0 + a^2 Y^{neg} & Y^0 + a Y^{neg} & Y^0 + Y^{neg} \end{pmatrix} \begin{pmatrix} V_a \\ V_b \\ V_c \end{pmatrix}$$

and the abc phase power S for these loads is just the positive-sequence specified value. The three-phase load is thus modeled as three loads each consisting of a constant-power term in parallel with a constant-admittance term; notice however, that the three phases are coupled in this latter case.

Similarly, generators may be modeled as a combination of specified PV positive-sequence values and zero-sequence and negative-sequence admittances. By the theory of symmetrical components, one arrives to an expression for the abc admittances completely analogous to the PQ case above. For more details on the symmetrical components technique, refer for instance to P. M. Anderson, "Analysis of Faulted Power Systems" (Wiley-IEEE Press 1995).

Once this procedure is complete, one can proceed with the method as described in U.S. Pat. No. 7,519,506, the specification of which is incorporated herein in its entirety. The key idea consists in constructing a holomorphic embedding by means of a complex parameter s in such a way that the equations L(s) become linear for s=0, while they revert to the original problem for s=1. In our case, the simplest of such possible embeddings consists in the following:

$$\sum_{j=1}^{aN} Y_{ij}V_j(s) = \frac{sS_i^*}{V_i^*(s^*)} + I_i + Y_iV_i(s)$$

Which, as one can see, renders the system linear for s=0. Since the embedding is holomorphic, it defines $V_i(s)$ as holomorphic function of the complex parameter s, and by calculating the power series expansion of $V_i(s)$, one can obtain the values of V for s=1, which is the solution to the original power flow problem. The method proceeds by developing the voltages $V_i(s)$ and all other functions of $V_i(s)$ in their power series expansion:

$$V_i(s) = \sum_{k}^{\infty} V_i[k]s^k$$

$$\frac{1}{V_i(s^*)} = \sum_{k}^{\infty} W_i[k]s^{*k}$$

By substituting this expansion into the L(s) system of equations, and equating the terms corresponding to each power $s^k$, one obtains equations for all the coefficients $V_i[k]$ up to the desired order of approximation.

Note that, in finding a suitable choice for the embedding, one should also pay attention to the resulting expressions for the coefficients of the series expansion of the nonlinear functions in Vi(s) (the inverse of V, in our case). With this choice of embedding, it is easy to see that the coefficients $W_i[k]$ at order k can be obtained from the values of all previous coefficients of $V_i$ up to order k−1, while at the same time the equations for $V_i[k]$ only involve $W_i[k-1]$. Therefore, we are able to obtain all the coefficients of $V_i$ up to any desired order.

Finally, the method concludes by computing the sum of the series at s=1 by means of a suitable technique. As it is well known in the field of function approximation, naïve summation of the power series is almost never feasible. Since the voltages are holomorphic algebraic functions, the most natural and computationally efficient technique is to use algebraic approximants, namely Padé approximation. This is well described in the literature; see for instance G. A. Baker and P. Graves-Morris, "Padé Approximants, Second Edition," Encyclopedia of Mathematics and its Applications, Volume 59 (Cambridge University Press, 1996).

In a second preferred embodiment of the method, an alternate embedding L(s) is chosen in such a way that the system at s=0 is perfectly balanced and without any cross-phase mutual admittances. Then the system at s=0 decouples into three linear systems that can be solved separately, thus obtaining a potentially large advantage due to the computational effort involved in solving linear systems. For networks with a high degree of meshing and mutual admittances (little sparsity) the savings can approach an overall factor of nine, due to the $O((3N)^3)$ vs. $O(3N^3)$ asymptotic costs.

Again, the method can be applied to the power flow system written either in terms of the phase-components or in terms of the symmetrical-components. When the network has a perfectly balanced structure with symmetric mutual impedances as in equation (2) above, writing the equations in terms of symmetrical components has the advantage that the system is already decoupled; the downside is that one has to convert all the specified PQ injections given in terms of phase components into their equivalent symmetrical components.

For general power flow studies, the formulation based on phase components is to be favored over the one based on symmetrical components, because it has a clearer physical interpretation when nonlinear injections are present. Therefore, the method described here can be seen as providing an alternative way to uncouple the phases while keeping the equations written in phase components.

As described above, any PQ loads or PV generators in which there are any specified zero-sequence or negative-sequence admittances will have to be converted into their abc phase sequence equivalents. With this preliminary step out of the way, the method will begin with an ordering of the bus labeling of type "phase-major-order", which will allow for decoupled matrix blocks to appear in our linear system:

Phase a buses: 1, . . . , N
Phase b buses: N+1, . . . , 2N
Phase c buses: 2N+1, . . . , 3N Formally, the system of power flow equations L is written in the same way as before:

$$\sum_{j=1}^{aN} Y_{ij}V_j = \frac{S_i^*}{V_i^*} + I_i + Y_iV_i$$

However, the admittance matrix has now the following block structure:

$$\begin{pmatrix} Y^{aa} & Y^{ab} & Y^{ac} \\ Y^{ba} & Y^{bb} & Y^{bc} \\ Y^{ca} & Y^{cb} & Y^{cc} \end{pmatrix}$$

The off-diagonal blocks contain all the cross-phase mutual impedances, which can now be balanced or not. The method consists in choosing a holomorphic embedding L(s) where the off-diagonal terms are affected by the complex parameter s:

$$\begin{pmatrix} Y^{aa} & sY^{ab} & sY^{ac} \\ sY^{ba} & Y^{bb} & sY^{bc} \\ sY^{ca} & sY^{cb} & Y^{cc} \end{pmatrix}$$

and the nonlinear injections are also embedded as before. Then the explicit equations for the embedded system L(s) become, for example for phase a:

$$\sum_{j=1}^{aN} Y_{ij}^{aa}V_j(s) = \frac{sS_i^*}{V_i^*(s^*)} + I_i + Y_iV_i(s) - \sum_{j=N+1}^{2N} sY_{ij}^{ab}V_j(s) - \sum_{j=2N+1}^{aN} sY_{ij}^{ac}V_j(s)$$

and similarly for phases b and c.

The rest of the method proceeds as in the previous case. As we can see, the system decouples into three separate linear systems and the coefficients $V_i[k]$ can always be computed at each order k of the power series expansion, using the results from the previous orders. As before, the linear systems to be solved at each order all share a fixed matrix and it is only the right hand side vector that changes from one order to the next, so that the computational effort to LU-decompose the matrix only needs to be performed once. Moreover, if the structure of the three-phase network were balanced ($Y^{aa}=Y^{bb}=Y^{cc}$), then there would be only one matrix decomposition to be done, instead of three.

The invention has been described with references to specific embodiments. While particular values, relationships, materials and steps have been set forth for purposes of describing concepts of the invention, it will be appreciated by persons skilled in the art that numerous variations and/or modifications may be made to the invention as shown in the disclosed embodiments without departing from the spirit or scope of the basic concepts and operating principles of the invention as broadly described. It should be recognized that, in the light of the above teachings, those skilled in the art could modify those specifics without departing from the invention taught herein. Having now fully set forth certain embodiments and modifications of the concept underlying the present invention, various other embodiments as well as potential variations and modifications of the embodiments shown and described herein will obviously occur to those skilled in the art upon becoming familiar with such underlying concept. It is intended to include all such modifications, alternatives and other embodiments insofar as they come within the scope of the appended claims or equivalents thereof. It should be understood, therefore, that the invention might be practiced otherwise than as specifically set forth herein. Consequently, the present embodiments are to be considered in all respects as illustrative and not restrictive.

What is claimed is:

1. A computer implemented method, comprising:
    a. for an active power bus in a three-phase power generating system having an electrical grid, said active power bus being modeled in terms of symmetrical components, transforming negative-sequence and zero-sequence admittances into phase-sequence equivalent admittances;
    b. for a reactive power load in said three-phase power generating system, said reactive power load being modeled in terms of symmetrical components, transforming negative-sequence and zero-sequence admittances into phase-sequence equivalent admittances;
    c. generating a mathematical model of power flow equations L in terms of three phase components of the three-phase power generating system using the phase-sequence equivalent admittances;
    d. embedding the mathematical model in a holomorphic embedding of the power flow equations (L(s)), where s is a variable in a complex domain that includes a value s=0 corresponding to a no load case (L(0)), in which there are no non-linear injections at any bus of the electrical grid and the value s=1 corresponding to an objective case (L(1)) representative of the electrical grid in a problem case, and wherein each variable of the power flow equations (L) is contained in L(s) as a function of the variable s by said holomorphic embedding;
    e. transcribing the holomorphic embedding into software for use in a computer processor adapted to execute said software;
    f. developing in power series, values of unknowns in parameters of the holomorphic embedding (L(s)), using said computer processor, wherein the values of s are in a neighborhood of the value for the no load case of each parameter of the power flow equations;
    g. said computer processor evaluating coefficients of the power series by solving resulting linear systems, order after order of the power series, up to an order determined by desired accuracy;
    h. said computer processor evaluating values for unknowns in said holomorphic embedding for the problem case, s=1; and
    i. computing the power series summation to the desired accuracy.

2. The computer implemented method of claim 1, wherein said step of computing the power series summation to the desired accuracy further comprises using said computer processor to approximate a solution using n-order algebraic Padé approximants.

3. The computer implemented method of claim 1, wherein said step of computing the power series summation to the desired accuracy further comprises using said computer processor to approximate a solution using continued fractions.

4. The computer implemented method of claim 1, wherein the admittance matrix is rearranged, and mutual coupling between different phases are absorbed into the holomorphic embedding.

5. The computer implemented method of claim 4, wherein the power generating system is decoupled for solution as three separate linear systems.

6. The computer implemented method of claim 1, wherein said method is employed for either real-time or off-line analysis.

7. The computer implemented method of claim 6, wherein said method is employed for either balanced or unbalanced electric power systems.

8. The computer implemented method of claim 1, further comprising:
    prior to said embedding, receiving data from a supervisory and data acquisition system representative of conditions of said electrical grid, and
    forming said power flow equations (L) from said data.

9. The computer implemented method of claim 8, further comprising:
    repeating said receiving step and steps d through i continuously to provide a continuous, real time measure of the power flow in the power generating system.

10. A computer implemented method, comprising:
    transforming negative-sequence and zero-sequence admittances for an active power bus in a three-phase power generating system having an electrical grid into phase-sequence equivalent admittances, said active power bus being modeled in terms of symmetrical components;
    transforming negative-sequence and zero-sequence admittances for a reactive power load in said three-phase power generating system into phase-sequence equivalent admittances, said reactive power load being modeled in terms of symmetrical components;
    generating a mathematical model of power flow equations for said three-phase power generating system in terms of three-phase components of said three-phase power generating system using said phase-sequence equivalent admittances;
    embedding said mathematical model in a holomorphic embedding of said power flow equations using a variable in a complex domain that includes a first value corresponding to a no load case, in which there are no nonlinear injections at any bus of said electrical grid and a second value corresponding to an objective case representative of said electrical grid in a problem case, each variable of said power flow equations being contained said holomorphic embedding as a function of said variable;

transcribing said holomorphic embedding into software for use in a computer processor adapted to execute said software;

developing in power series, values of unknowns in parameters of said holomorphic embedding, using said computer processor, said values of said unknowns in said parameters being in a neighborhood of said first value for said no load case of each parameter of said power flow equations;

said computer processor evaluating coefficients of said power series by solving resulting linear systems, order after order of said power series, up to an order determined by desired accuracy;

said computer processor evaluating values for unknowns in said holomorphic embedding for the problem case; and computing summation of said power series to said desired accuracy.

11. The computer implemented method of claim 10, said computing said summation of said power series to said desired accuracy further comprising using said computer processor to approximate a solution to said holomorphic embedding using one of n-order algebraic Padé approximants and continued fractions.

12. The computer implemented method of claim 10, a matrix of said phase-sequence equivalent admittances being rearranged, and mutual coupling between different phases of said three-phase power generating system being absorbed into said holomorphic embedding.

13. The computer implemented method of claim 10, said three-phase power generating system being decoupled for solution as three separate linear systems.

14. The computer implemented method of claim 10, further comprising:

receiving data from a supervisory and data acquisition system representative of conditions of said electrical grid, and forming said power flow equations from said data.

15. The computer implemented method of claim 14, further comprising:

continuously providing a measure of power flow in said three-phase power generating system, based on said data from said supervisory and data acquisition system.

* * * * *